United States Patent [19]

Gifford et al.

[11] Patent Number: 5,200,023
[45] Date of Patent: Apr. 6, 1993

[54] INFRARED THERMOGRAPHIC METHOD AND APPARATUS FOR ETCH PROCESS MONITORING AND CONTROL

[75] Inventors: George G. Gifford, Bethel, Conn.; James A. O'Neill, New City, N.Y.

[73] Assignee: Internatinal Business Machines Corp., Armonk, N.Y.

[21] Appl. No.: 753,189

[22] Filed: Aug. 30, 1991

[51] Int. Cl.$^5$ .................. B01J 19/12; H05H 1/46; C23C 14/52

[52] U.S. Cl. .................. 156/626; 156/643; 204/192.33; 204/298.32

[58] Field of Search .................. 204/192.33, 298.32, 204/192.13, 298.03; 156/626, 643

[56] References Cited

U.S. PATENT DOCUMENTS

| | | | |
|---|---|---|---|
| 3,664,942 | 5/1972 | Havas et al. | 204/192.33 |
| 3,718,757 | 2/1973 | Gulita et al. | 358/113 |
| 4,396,478 | 8/1983 | Aizenshtein et al. | 204/192.13 |
| 4,675,072 | 6/1987 | Bennett et al. | 156/626 |
| 4,883,560 | 11/1989 | Ishihara | 156/626 |
| 4,913,790 | 4/1990 | Narita et al. | 204/192.13 |
| 4,919,542 | 4/1990 | Nulman et al. | 374/9 |
| 4,936,967 | 6/1990 | Ikuhara et al. | 204/192.33 |
| 4,971,653 | 11/1990 | Powell et al. | 156/626 |

FOREIGN PATENT DOCUMENTS

| | | | |
|---|---|---|---|
| 56-47569 | 4/1981 | Japan | 156/626 |
| 57-201020 | 12/1982 | Japan | 204/192.33 |
| 1-25418 | 1/1989 | Japan | 156/626 |
| 3-102821 | 4/1991 | Japan | 156/626 |
| 3-105920 | 5/1991 | Japan | 156/626 |

OTHER PUBLICATIONS

Schwartz et al., Plasma Processing, ed. R. G. Freiser and C. J. Mogab, pp. 133–154, The Electrochemical Society Softbound Proceedings Series, Pennington, NJ, 1981.
Danner et al., *J. Electrochem. Soc.*, 133:151–155, (1986).
Hoekstra, *IBM Tech. Discl. Bull.*, Nov. 1973, p. 1821, (1973).
Kaplan, *Photonics Spectra*, Dec. 1987, pp. 92–95.
Capra, Printed Circuit Board Failure Analysis Using Infrared Thermography, Probeye Infrared Products Application Note 102-250687, Hughes Aircraft Co.
Capra, Fault Detection in Microelectronic Circuits, Probeye Infrared Products Application Note 101-250587, Hughes Aircraft Co.
Patel et al., Application of Thermal Imaging Methodology for Plasma Etching Diagnosis, SPIE'S Technical Symposium on Microelectronic Processing Integration, Sep. 1991.
Fukuda et al., Effects of Excited Plasma Species on Silicon Oxide Films Formed by Microwave Plasma CVD, 1035–1040.
Gartner et al., In Situ Thermal Control/Monitor System for Reactive Ion Etch Process, *IBM Technical Disclosure Bulletin*, vol. 20, No. 3, Aug. 1977, p. 994.

*Primary Examiner*—Aaron Weisstuch

[57] ABSTRACT

An infrared television camera (20) monitors the etching of a substrate (26) in-situ in an etch chamber (24). Temporal and spatial resolution of IR emissions is obtained by monitoring the top surface of the substrate (26) in two-dimensions throughout the course of the etching process. Anomalies in temperature detected on the top surface of the substrate (26) can indicate defects in the substrate (26) itself or in the operation of the etching apparatus. Process feedback control is achieved by adjusting various parameters of the etching apparatus (i.e., gas-pressure, flow pattern, magnetic field, coolant flow to electrode, or the like) to compensate for etching anomalies. Etch uniformity and etch endpoint monitoring is achieved by monitoring the IR emissions resulting from exothermic reaction of the film being etched. IR emissions decline at the end of an exothermic etch reaction. Particulate matter which might otherwise harm the substrate (26) can be identified in the gas-phase with a second IR television camera (34) which images the region above the substrate (26). Particulate matter appears as localized "hot spots" within the gas plasma, and the identification of particulate matter allows corrective measures to be taken.

33 Claims, 3 Drawing Sheets

INFRARED THERMOGRAPHIC METHOD AND APPARATUS FOR ETCH PROCESS MONITORING AND CONTROL

BACKGROUND OF THE INVENTION

1. Field of the Invention

The present invention generally relates to a non-invasive, in-situ method and apparatus for monitoring and controlling etch processes. In particular, the invention includes controlling etch uniformity and relative etch rate, as well as detecting etch endpoint and monitoring gas-phase species above a substrate to identify particulate contamination.

2. Description of the Prior Art

Many semiconductor manufacturing processes are sensitive to changes in wafer temperature. The ability to determine the substrate temperature and to monitor changes in its value over long periods of time is important in process characterization and control. In plasma processing, energetic ion bombardment and radio frequency (RF) induced eddy currents lead to an increase in wafer temperature. In addition, wafer temperature can increase from reaction exothermicity. For example, Schwartz et al. in "Plasma Processing," ed. R. G. Freiser and C. J. Mogab, pp. 133-154, *The Electrochemical Society Softbound Proceedings Series*, Pennington, NJ (1981), reported that an exothermic etching reaction occurs when etching silicon in a chlorine ambient, and Donner et al. in *J. Electrochem. Soc.*, 133:151-155 (1986), reported that an exothermic etching reaction occurs when etching aluminum in a chlorine ambient.

Several techniques have been used for monitoring plasma etching conditions while etching a substrate. For example, optical emission spectroscopy (OES) and laser induced fluorescence (LIF) techniques have been used to detect the etch endpoint in semiconductor manufacturing. However, OES and LIF techniques both use gas-phase species as an indirect indicator of the reaction occurring on the substrate surface and do not directly monitor conditions on the substrate. Laser interferometry has been widely used as a technique to monitor the progress of an etching reaction; however, this technique relies on the presence of a smooth, reflective "test point" (fiducial) on the wafer. Hoekstra, in *IBM Tech. Discl. Bull.*, 11/73, p. 1721 (1973) descrives a process of etch reaction control which utilizes localized heating to maintain uniformity of the etching process across a wafer surface. Hoekstra monitors the etch rate at various points across the wafer electrically and controls the rate of etching through external application of heat.

Infrared thermography is a well known technique for non-invasive (non-contact) monitoring of the temperature of materials in harsh environments. In infrared thermography, a measurement of the intensity of infrared radiation (IR) emanating from an object and a knowledge of the emissivity of the material from which the object is made are used to determine the temperature of the object. IR thermography has made been used in many manufacturing processes. For example, U.S. Pat. No. 3,718,757 discloses the use of an IR television camera to monitor a crystal pulling operation wherein the detected video signal is indicative of the temperature at a surface point being analyzed. Similarly, Kaplan in *Photonics Spectra*, Dece. 1987, pp. 92-95, discusses the use of IR sensors and scanners in metal extrusion processes. IR thermography has also been used in the microelectronics field. For example, Hughes Aircraft Company manufactures a thermal imaging microscope and video system called the Probeye ® which may be used to detect excessive junction temperatures.

U.S. Pat. No. 3,664,942 to Havas et al., which issued to IBM Corporation in 1972, discloses detecting the etch endpoint in a sputter etching procedure with an IR camera. In Havas et al., the emissivity of an object is monitored as layers of material are removed. Emissivity is a physical property of a material (like thermal conductivity) and reflects the ratio of radiation intensity from a surface to the radiation intensity at the same wavelength from a black body at the same temperature. An important drawback of a monitoring system which only monitors changes in emissivity (like Havas et al.) is that it cannot be used to distinguish between two layers of a stack which have similar emissivity levels at the sensing wavelength (e.g., $SiO_2$, and Si in a stack at sensing wavelengths of 2–4 $\mu$m). Moreover, the actual substrate temperature may remain unchanged while the emissivity may change greatly due to different materials (with different emissivity) being etched; therefore, substrate temperature conditions are not monitored.

U.S. Pat. No. 4,936,967 to Ikuhara et al. shows a system that analyzes a wavelength of the plasma spectrum above a substrate during etching rather than monitoring the substrate. While Ikuhara contemplates monitoring the plasma, it does not provide any means for identifying suspended particles in the plasma which may compromise the parts being etched.

SUMMARY OF THE INVENTION

It is therefore an object of the present invention to provide an improved method for monitoring and controlling plasma etching of a substrate.

It is another object of the invention to utilize the sensed exothermicity of the chemical etching reaction, in addition to the sensed emissivity, to monitor the etch-through of different layers of material on a substrate.

It is yet another object of the invention to provide a means for identifying the presence of suspended particulate contaminants in the etch plasma before the parts being etched are compromised.

According to the invention, a non-invasive, in-situ technique for monitoring and controlling etching plasmas based on infrared thermometry uses the sensed, exothermically induced, substrate temperature rise during the course of an etch reaction to provide a means to control the etch process itself. In addition, a two dimensional IR camera arrangement allows monitoring the substrate and platform as well as the gas plasma in the etch chamber, whereby the detection of excess temperatures on the substrate and electrode and nonuniformities in the plasma are used to control the etch process.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
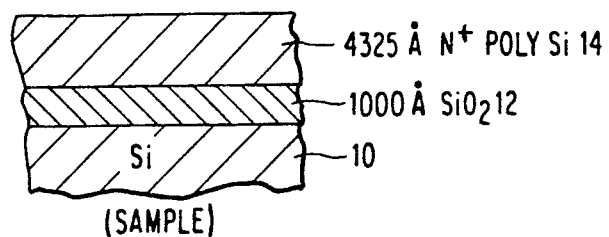
FIG. 1 is a cross-sectional sideview of a N+ doped polysilicon film on a quartz ($SiO_2$) covered silicon wafer.

Referring now to the drawings, and more particularly to FIG. 1, there is shown a cross-sectional side view of a test substrate which includes a Si wafer base 10, a 1000 Å $SiO_2$ middle layer 12, and a 4325 Å N+ polysilicon top layer 14. It should be understood that the test substrate is merely one example of the many types of materials which are commonly etched by plasma processing techniques and is not considered a limiting part of the invention. Rather, the test substrate shown in FIG. 1 was etched in a $CF_2Cl_2$/Ar plasma (10 SCCM, 50 mTorr, 0.5 W/cm$^2$, −110 V DC bias) while monitoring IR emissions (the data being presented in FIG. 2) and the information from that experiment demonstrates the validity of the etch process controls which are the main focus of this invention. The invention can be practiced in the field of semiconductor processing as well as in other fields which require plasma etching of substrates.

If IR thermography is to be used effectively for etch monitoring, several things should be considered. First, the IR detector must be calibrated to the emissivity of the substrate under observation. Such calibration is easily performed through an independent temperature determination (thermocouple, etc.) prior to the process run. Also, care must be exercised to insure that infrared radiation from another source in the process system, such as a heated electrode, is not transmitted through the sample under observation. Such effects are especially important in semiconductor processing systems since substrates such as lightly doped silicon are transparent in the infrared. As in U.S. Pat. No. 3,664,942 to Havas et al., the heat pass through effect can be minimized by placing the substrates on a water cooled electrode which has a temperature kept less than or equal to the substrate under observation. The emissivity of the substrate may change during the etching reaction due to surface roughening; however, these changes have been found not to affect the measured temperature significantly when compared to the heat released during the etching of polysilicon. Recent advances in IR thermometry have led to the development of infrared video imaging systems composed of an array of IR sensitive elements which are cooled to reduce background noise. Examples of these type of arrays are available from the following companies: Mikron Corporation and Hughes Corporation. Because of their spatially and temporally resolved temperature monitoring capabilities, it is preferable that these types of cooled, IR sensitive element arrays be used in the practice of the present invention.

Figure 2:
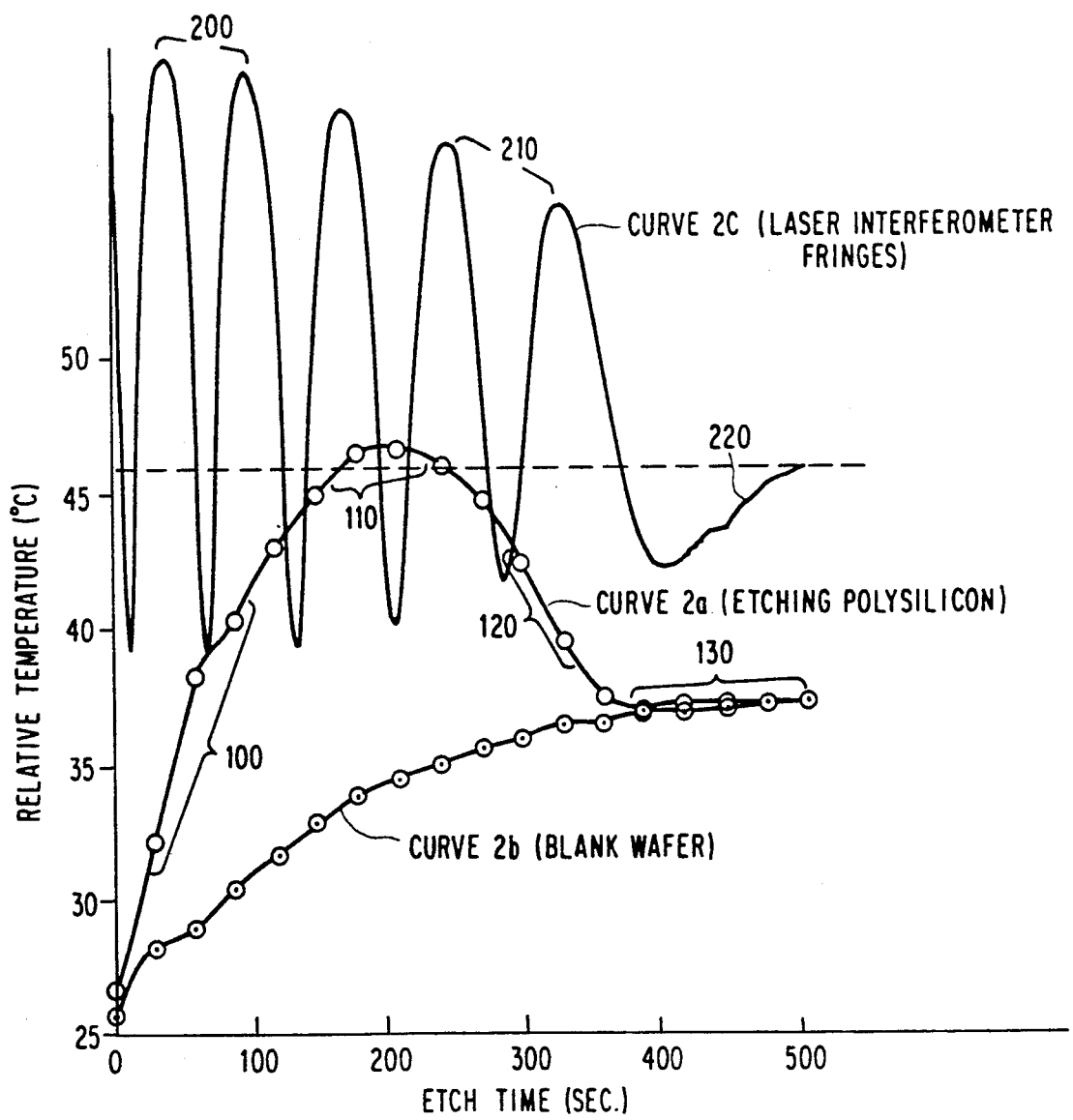
FIG. 2 is a graph showing the curves for the relative temperature of the substrate of FIG. 1 before and after etching (curves a and b) and a curve of laser interferometer fringes (curve c) taken during etching.

Referring now to FIG. 2, curve 2a shows the relative temperature of the substrate described in FIG. 1 throughout the course of etching with a $CF_2Cl_2$/Ar plasma under the conditions described above. $CF_2Cl_2$/Ar plasma was chosen for the experiment because it selectively removes polysilicon from quartz and the exothermicity of the quartz etching reaction is much less than that for silicon etching. The relative temperature was determined by IR thermometry with an IR camera positioned outside the etch chamber which imaged the top surface of the substrate. Section 100 of curve 2a shows that after the discharge is initiated, the temperature of the substrate rises rapidly due to energetic ion bombardment as well as the exothermicity of the etching reaction of N+ doped polysilicon. Section 110 of curve 2a is a plateau-type region where the substrate temperature reaches a steady state level in which the rate of heating equals the rate of heat loss through conductive, convective and radiative processes. Section 120 of curve 2a is a gradual declining region that occurs as the etch endpoint nears. The relative temperature of the substrate begins to drop, as shown by section 120, as regions of polysilicon are cleared from the $SiO_2$ and less heat is evolved from the etching reaction. The temperature drop indicated by section 120 is gradual because the etching in the present experiment was non-uniform. Two dimensional video images (not shown) of the substrate surface revealed that as the substrate was being etched, there was a radial variation in wafer temperature due to nonuniform etching. After the polysilicon film is removed, the substrate temperature remains relatively constant, as is indicated by section 130 of curve 2a, since the exothermic heat evolved from etching the $SiO_2$ is much less than that which results from etching polysilicon. Upon termination of the exothermic etching reaction, the plasma discharge is terminated and the substrate is cooled.

To determine that the IR thermometry system was sensing the exothermic effects of the plasma reaction of etching polysilicon, the same substrate which was etched and produced curve 2a was exposed to a second, identical plasma etch run as the first plasma etch run. Curve 2b of FIG. 2 shows the relative temperature data obtained with the IR thermometry system when the substrate was exposed to the plasma for a second run. As can be seen from curve 2b, the temperature of the substrate rises to the same steady state level 130 as was achieved at the end of the first run. The temperature rise in the second run is primarily due to energetic ion bombardment. The difference between the substrate temperature at earlier times in the first run (curve 2a) and at earlier times in the second run (curve 2b) is due to the substrate heating which arises from the exothermic polysilicon etching reaction. Therefore, the exothermic reaction which occurs as different layers of material, which have different reaction exothermicities, are etched may be used to determine etch endpoint.

To determine that the IR thermometry system contemplated by this invention accurately reflects the entire polysilicon etch process including providing an accurate indication of etch endpoint, laser interferometry was used to monitor the etch reaction as a double check on the IR thermometry system. Laser interferometry is a well known technique which is commonly used in etch monitoring. The laser (not shown) was operated independently from the etching reactor and IR thermometry system. Curve 2c of FIG. 2 shows the interference fringes detected using the laser interferometry system. The fringes 200 are large at the beginning of the etch process, become smaller 210 as the etch endpoint approaches, and become negligible 220 when the endpoint is achieved. Comparing curve 2a and curve 2c of FIG. 2, it can be seen that the exothermic reaction monitored with the inventive IR thermometry system and method corresponds very well with the data obtained using laser interferometry techniques. In particular, section 100 of curve 2a, which reflects the heat increase at the beginning of the polysilicon etch, corresponds with the large fringes 200 of curve 2c detected by laser interferometry, section 120 of curve 2a, which reflects the gradual decrease in heat associated with having a decreased amount of polysilicon being etched, corresponds with the smaller fringes 210 of curve 2c, and section 130 of curve 2a, which reflects the steady state of heat due to the energetic ion bombardment of the plasma, but without the exothermic heat resulting from polysilicon etching since the polysilicon has been etched away at this point, corresponds with the negligible fringes 220 of curve 2c.

As discussed above, in U.S. Pat. No. 3,644,942 to Havas et al., changes in the emissivity of materials can be monitored to determine etch endpoint. In order for the Havas et al. system to work properly, the layers of material on the substrate being etched must have divergent emissivities at a specified sensing wavelength, e.g., silver and chromium. A major drawback of Havas et al. overcome by the present invention is that the etch through of materials which have similar emissivities, (e.g., silicon which has a emissivity of 0.03–0.05 and $SiO_2$ which has a emissivity of 0.05–0.07 for detection wavelengths of 2–4 $\mu m$ which are required for low temperature measurements), can be discerned. This is accomplished by monitoring the temperature of the substrate being etched rather than simply the emissivity. Temperature, as measured via IR thermography, is a function of both the detected IR radiation emanating from the substrate and the known IR emissivity of the substrate. Temperature during plasma etching is affected by both the ion bombardment and the exothermic reaction which occurs as the film layer is etched away. By monitoring the heat attributable to the exothermic reaction (contrast curves 2a and 2b in FIG. 2), the etch through of a layer which has a different exothermicity from an underlying layer can be detected (e.g., curve 2a in FIG. 2 illustrates the exothermic polysilicon etching reaction being distinguishable from the $SiO_2$ etching reaction.

Slight discrepancies in the steady state substrate temperature after long periods of time may arise because of roughening of the substrate surface which affects emissivity. Hence, changes in the IR emissivity due to film removal can be monitored by comparing the measured temperature before and after a process run after the wafer cools. The temporal resolution of 1/30 second is attainable with commercially available IR thermal imagers (e.g., Hughes Probeye ®) and this provides for real time monitoring capabilities and allows rapid feedback for process control. It is anticipated that IR thermometry can be used as a process control as well as an endpoint detection means where, for example, upon sensing fluctuations in the temperature of a substrate during the etch process, the RF power applied to the reactor can be adjusted. Process reproducibility can be determined accurately through a comparison of the spatially and temporally resolved thermal profiles of substrates in different runs.

Figure 3A:
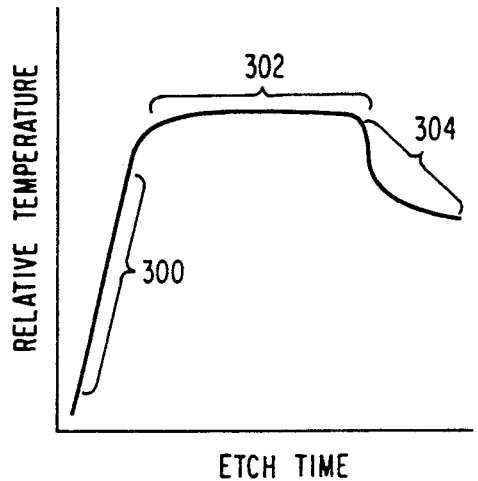
FIGS. 3a and 3b are graphs showing the relative temperature of a substrate can be used as a feedback monitor of etch rate.
Figure 3B:
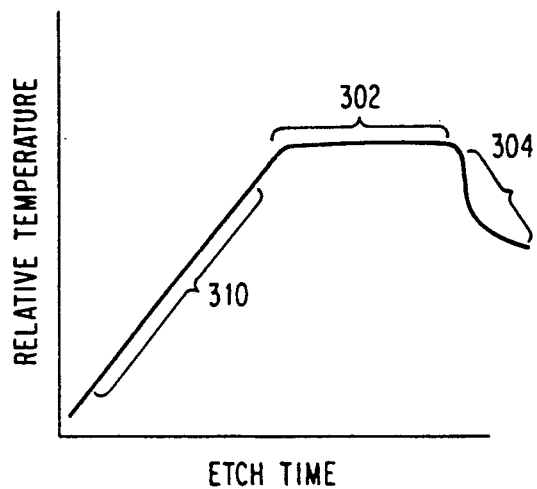

FIGS. 3a and 3b show that IR thermometry according to the present invention can be used as a feedback control for monitoring etch rate. Both FIGS. 3a and 3b show curves similar to curve 2a in FIG. 2 where the etch reaction curve has an initial rise in temperature 300 or 310 at the start of the etch, a plateau region 302 where the substrate temperature reaches a steady state level in which the rate of heating equals the rate of heat loss through conductive, convective and radiative processes, and a declining region 304 where the temperature drops gradually as the temperature affects due to exothermic substrate heating decline as the layer with a plasma reaction exothermicity is etched through. Experimentally, it has been found that the rate of exothermic heating increases with increasing etch rates. Focusing on the slope of sections 300 and 310 in FIGS. 3a and 3b, respectively, it can be seen that the greater exothermic heating occurs with the substrate corresponding to FIG. 3a, as is evidenced by the steeper sloped section 300, than with the substrate corresponding to FIG. 3b. Since increased etch rates can be caused by using higher power in the etch reactor, the difference in initial slope discussed in conjunction with FIGS. 3a and 3b can be used as a feedback control for power regulation. The absolute etch rate corresponding to a measured rate of substrate temperature rise can be calibrated using laser interferometry. Under conditions where the substrate temperature typically achieves a steady state value, fluctuations in the etch rate within a run can be observed by following any variations in the temperature during the plasma process.

Figure 4A:
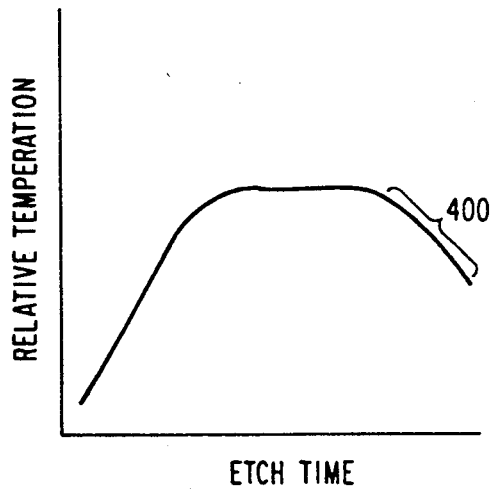
FIGS. 4a and 4b are graphs showing the relative temperature of a substrate can be used as a feedback monitor of etch uniformity.
Figure 4B:
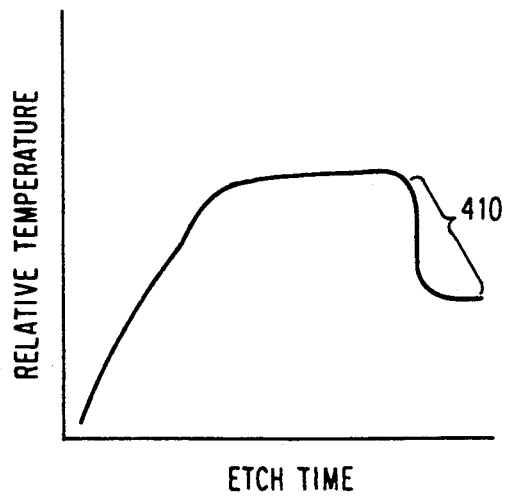

FIGS. 4a and 4b show that IR thermometry according to the present invention can be used to monitor etch uniformity. As discussed in conjunction with FIGS. 3a and 3b, FIGS. 4a and 4b show curves similar to curve 2a in FIG. 2. The decline in temperature section 400 of the thermometry curve in FIG. 4a is much more gradual than the decline in temperature section 410 of the thermometry curve in FIG. 4b. These results indicate that the plasma etching was more uniform with the substrate in FIG. 4b than with the substrate in FIG. 4a. If all or most of a layer which yields an exothermic plasma etching reaction is etched through in a uniform fashion, the detected temperature for the substrate would be expected to drop uniformly, as is indicated in FIG. 4b. However, if plasma etching is not uniform, parts of the layer will be etched through at a different times; hence, the decline in temperature due to the removal of the layer will be more gradual.

Figure 5:
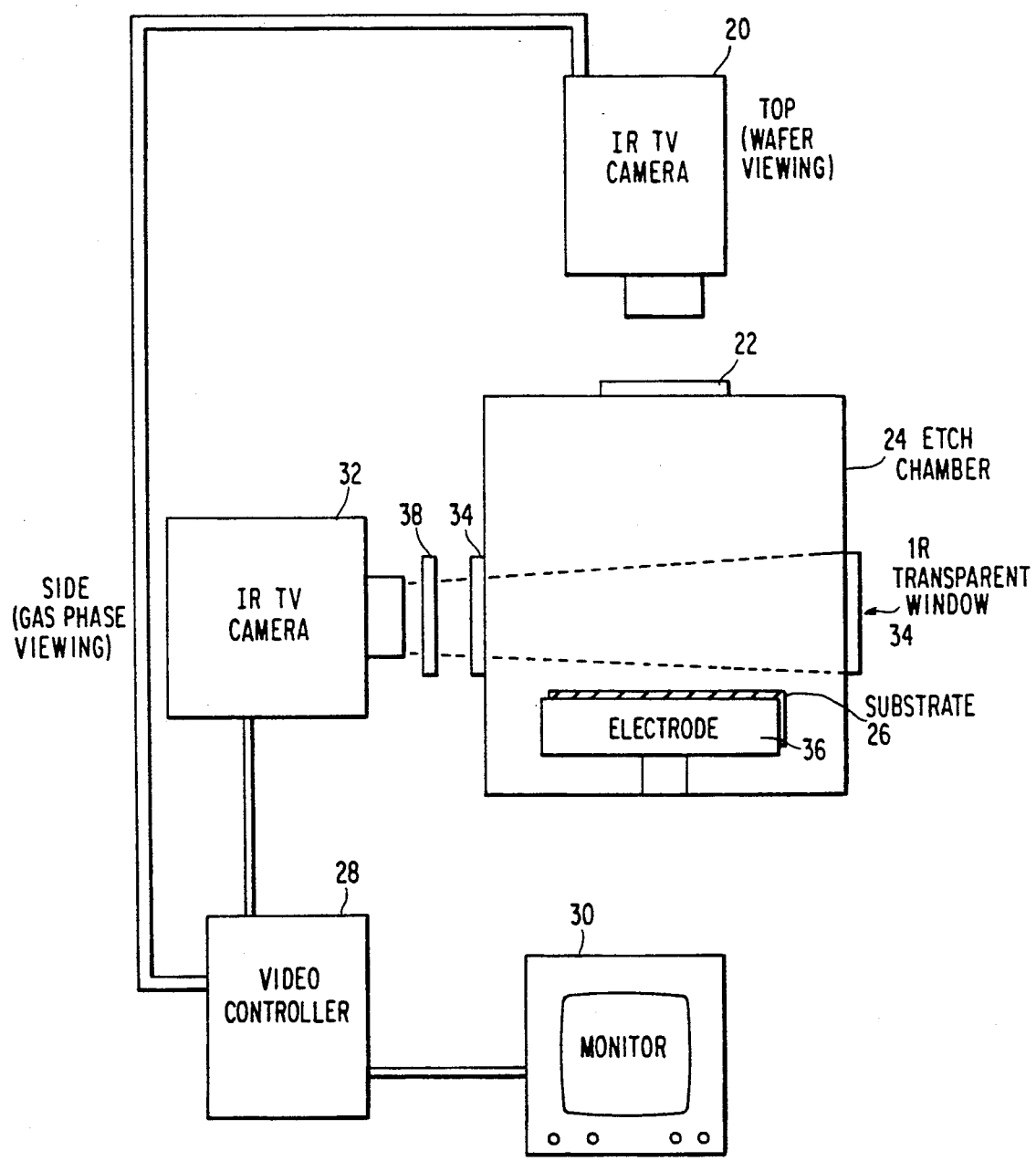
FIG. 5 is a two-dimensional diagram of an etching chamber wherein two IR television cameras are used to monitor the wafer and the plasma gas during etching.

FIG. 5 shows an apparatus which may be used to implement the in situ monitoring technique. A remote television camera 20 equipped with a two-dimensional IR sensitive array is directed through an IR transparent window 22 in the etch chamber 24 towards the substrate 26. Suitable IR television cameras 20 are available from Hughes Corporation and Mikron Corporation. The two-dimensional IR sensitive array allows for spatial resolution of the substrate 26 surface temperature during processing in the etch chamber 24, and temporal resolution is achieved by monitoring the substrate 26 over time. The thermal profile of the entire wafer can be monitored during the etching process by sending sensed IR emission data from the IR television camera 20 to a video controller 28 which outputs the signals to monitor 30. The minimum spatial resolution which can be achieved with available IR video systems is limited by the wavelength of the IR emission (several microns), while the thermal resolution is approximately 0.1° K. Heavily doped silicon and metalized silicon wafers are the best candidates for substrate 26 to be monitored by IR thermometry since pure silicon as well as oxide and nitride films are transparent in the infrared region of the spectrum (i.e., low IR emissivity). The IR transparent window 22 must allow infrared radiation in at least the spectral range from 2 to 5.6 μm to pass through, which is the region of sensitivity for a typical IR camera equipped with a MCT detector for operation at temperatures less than 200° C. While thin quartz windows are functional in this region, their transmission at longer wavelengths is not optimal. A variety of other commercially available window materials are suitable, with the best candidate being zinc selenide with a thin film diamond or $Al_2O_3$ coating on the inner surface to prevent sputtering of the window material onto the substrate 26 surface. Zinc selenide windows transmit light from 600 nm to 20 μm.

In order to monitor the gas-phase region above the substrate 26, a second IR television camera 32 can be directed parallel to the substrate 26 surface through a second IR transparent window 34 on the side of the etch chamber 24. FIG. 3 shows the second IR transparent window 34 can be located on any side of the etch chamber 24. The second IR television camera 32 can be used in the same manner as first IR television camera 20, and provides temporal and spatial resolution of thermal events in the gas-phase of the etch chamber 24. It should be understood that a means can be provided to position the same IR television camera 20 at both the top and the side of the etch chamber 24 during a plasma run.

Positioning the IR television camera 20 above the substrate 26, as shown in FIG. 5, allows for monitoring the reaction-induced, two-dimensional thermal profile throughout the course of an etch process. Areas of the substrate 26 undergoing rapid etching appear hotter than those which are not being rapidly etched due to the heat released from the exothermic reaction. Also, areas which demonstrate anomalous etching due to gross substrate defects, cracks, scratches, or the like, can be detected through the presence of unusual (hot or cold) thermal profiles on the substrate 26 surface. Additionally, as indicated in FIGS. 4a and 4b, the rate of decrease in the substrate 26 temperature near the endpoint of the etching reaction is indicative of the process uniformity. The thermal uniformity and absolute temperature of a wafer electrode 36 and wafer clamping assembly (not shown) can also be determined using IR television camera 20 by direct observation with the monitor 30. In this manner, the efficiency of the electrode 36 cooling system can be evaluated and the effects of the process gas mixture on the wafer temperature can be examined. The information obtained during the etch process can then be used for process feedback control. For example, changing the gas-pressure or flow pattern in the etch chamber 24, changing the magnetic field strength in a magnetron etcher, adjusting the rate of flow or temperature of water to and from the electrode 36, or other appropriate adjustments can be made during processing while in-situ etch monitoring takes place.

Positioning the IR television camera 32 parallel to and directed above the substrate 26 allows for detecting the IR emissions from a variety of gas-phase species in the plasma with a two-dimensional spatial resolution. The course of an etch process can be monitored by sensing the emissions in the gas-phase. For example, the process endpoint can be determined by monitoring the time-dependent relative concentration of etch products throughout the course of the etching process. Infrared filters 38 may be used to differentiate emitting species in the plasma for identification. For example, carbon monoxide (CO) and carbon dioxide ($CO_2$) products of an $O_2$ ashing process can be identified by their characteristic IR emission bands at 5 μm and 4.3 μm, respectively. In another example, a process involving the etching of Si or $SiO_2$ in a fluorine containing environment yields $SiF_4$ with its characteristic emission at 10 μm; however, this example requires an IR transmissive window 34 like zinc selenide which has a wide enough bandpass range.

The side positioned IR television camera 32 has a particular advantage in detecting the presence of plasma-generated particles in the gas-phase region above the substrate 26. Particles which chip off the inside of the chamber 24 or from other sources may be deposited on the substrate 26 during processing and may hinder the performance of substrate produced, e.g. semiconductor chips made from the substrate 26. Experiments with an apparatus similar to that shown in FIG. 5 have shown particulate matter suspended in the gas-phase as a localized "hot spot". The presence of particles in the gas-phase was independently confirmed with laser light scattering techniques. These results indicate that the IR emission from the suspended particles is greater than that of the gas in the spectral region between 2 and 5.6 μm. In fact, $CF_2Cl_2$/Ar plasma is expected to emit little or no radiation in this region of the spectrum.

While the invention has been described in terms of its preferred embodiments wherein the exothermic reaction of a film being etched serves as a process feedback control and wherein IR television cameras with two-dimensional IR arrays are used to monitor the IR emissivity of both a substrate and gas-phase plasma above the substrate in-situ during etching, those skilled in the art will recognize that other apparatus arrangements can be used within the spirit and scope of the appended claims.

Having thus described our invention, what we claim as new and desire to secure by Letters Patent is as follows:

1. A method for detecting the presence and location of suspended plasma particulates in a plasma etch reactor, comprising the steps of:

positioning a substrate in said plasma etch reactor;

creating a plasma in said plasma etch reactor for etching said substrate;

monitoring infrared emissions emanating from said gaseous plasma during etching of said substrate; and detecting localized regions within said gaseous plasma which have infrared emission properties which differ from said gaseous plasma.

2. A method as recited in claim 1 further comprising the step of controlling said plasma etch reactor in response to the detection of said localized regions within said gaseous plasma.

3. A method as recited in claim 2 wherein said localized regions within said gaseous plasma have a greater intensity infrared emission than said gaseous plasma.

4. A method as recited in claim 2 wherein said step of controlling said plasma etch reactor includes the step of altering plasma conditions of said plasma in said plasma etch reactor.

5. A method as recited in claim 4 wherein said step of altering plasma conditions includes the step of changing a pressure of process gas inside said plasma etch reactor.

6. A method as recited in claim 4 wherein said step of altering plasma conditions includes the step of changing a flow of process gas inside said plasma etch reactor.

7. An apparatus for detecting the presence and location of suspended plasma particulates in a plasma etch reactor, comprising:

an infrared sensitive device positioned to image an area in said plasma etch reactor where gaseous plasma is generated for etching a substrate;

means for determining an intensity of infrared radiation in said area imaged by said infrared sensitive device;

means for allocating an intensity level for regions within at least two dimensions of said area imaged by said infrared sensitive device based on output from said means for determining;

means for identifying a background level of intensity of said infrared radiation representative of said gaseous plasma in said area imaged by said infrared sensitive device; and means for identifying localized regions within said area imaged by said infrared sensitive device which have a higher level of intensity than said background level of intensity of said infrared radiation.

8. An apparatus as recited in claim 7 wherein said infrared sensitive device includes a two dimensional array of infrared sensitive elements.

9. An apparatus as recited in claim 7 further comprising a means for cooling said two dimensional array of infrared sensitive elements to reduce background noise.

10. An apparatus as recited in claim 7 wherein said infrared sensitive device is positioned outside said plasma etch reactor behind an infrared radiation transparent window.

11. An apparatus as recited in claim 7 further comprising a means for controlling said plasma etch reactor in response to detecting said localized regions within said area imaged by said infrared sensitive device.

12. An apparatus as recited in claim 11 wherein said means for controlling produces a control signal which regulates a field between electrodes used for creating said gaseous plasma in said plasma etch reactor.

13. An apparatus as recited in claim 12 wherein said means for controlling produces a control signal which regulates a process gas used inside said plasma etch reactor.

14. A method for controlling plasma etching in a plasma etch reactor, comprising the steps of:

providing a substrate in said plasma etch reactor having at least two layers of film where an etch reaction exothermicity of a first layer of film is detectably greater than for a second layer of film on said substrate;

creating a plasma in said plasma etch reactor;

monitoring infrared emissions emanating from said substrate during plasma etching of said substrate;

detecting heating of said substrate caused by said etch reaction exothermicity of said first layer of film from said infrared emissions during plasma etching;

adjusting conditions in said plasma etch reactor in response to detected heating of said substrate caused by said etch reaction exothermicity of said first layer of film.

15. A method as recited in claim 14 wherein said step of adjusting includes the step of terminating plasma etching upon sensing a decline in etch reaction exothermicity.

16. A method as recited in claim 15 wherein said step of adjusting includes the step of controlling a field between electrodes used for creating said plasma in said plasma etch reactor.

17. A method as recited in claim 15 wherein said step of adjusting includes the step of controlling plasma gas parameters within said plasma etch reactor.

18. A method as recited in claim 15 wherein said step of adjusting includes the step of controlling cooling of equipment within said plasma etch reactor.

19. A method as recited in claim 15 wherein said step of monitoring includes the step of producing a spatial image of said infrared radiation emissions with respect to a surface of said substrate.

20. A method as recited in claim 19 further comprising the step of determining when regions of said surface of said substrate have divergent exothermic heating.

21. A method as recited in claim 15 wherein said step of detecting heating caused by etch reaction exothermicity includes the step of determining an initial rate of heating of said substrate.

22. An apparatus for controlling plasma etching of a substrate in a plasma etch reactor wherein said substrate in said plasma etch reactor has at least two layers of film where an etch reaction exothermicity of a first layer of film is detectably greater than for a second layer of film, comprising:

means for creating a plasma in said plasma etch reactor for etching said substrate;

means for monitoring infrared emissions emanating from said substrate during plasma etching;

means for detecting heating of said substrate caused by said etch reaction exothermicity of said first layer of film of said substrate from said infrared emissions occuring during plasma etching; and means for adjusting conditions in said plasma etch reactor in response to detected heating of said substrate caused by said etch reaction exothermicity of said first layer of film of said substrate.

23. An apparatus as recited in claim 22 wherein said means for monitoring comprises a two dimensional array of infrared sensitive elements.

24. An apparatus as recited in claim 23 further comprising a means for cooling said two dimensional array of infrared sensitive elements to reduce background noise.

25. An apparatus as recited in claim 23 wherein said means for monitoring is positioned outside said plasma etch reactor behind an infrared transparent window.

26. An apparatus as recited in claim 23 wherein said means for adjusting includes a means for terminating plasma etching in said plasma reactor upon sensing a decline in etch reaction exothermicity.

27. An apparatus as recited in claim 23 wherein said means for adjusting includes a means for controlling a field between electrodes used for creating said plasma.

28. An apparatus as recited in claim 23 wherein said means for adjusting includes a means for controlling plasma gas parameters within said plasma etch reactor.

29. An apparatus as recited in claim 23 wherein said means for adjusting includes a means for controlling cooling of equipment within said plasma etch reactor.

30. An apparatus as recited in claim 23 wherein said means for monitoring includes a means for producing a spatial image of said infrared radiation emissions with respect to a surface of said substrate.

31. An apparatus as recited in claim 31 further comprising a means for determining when regions of said surface of said substrate have divergent exothermic heating.

32. An apparatus as recited in claim 23 wherein said means for detecting heating caused by etch reaction exothermicity includes a means for determining an initial rate of heating of said substrate.

* * * * *

UNITED STATES PATENT AND TRADEMARK OFFICE
CERTIFICATE OF CORRECTION

PATENT NO. : 5,200,023
DATED : April 6, 1993
INVENTOR(S) : Gifford, et. al.

It is certified that error appears in the above-indentified patent and that said Letters Patent is hereby corrected as shown below:

On the Title page, item [73], Assignee should be --International Business Machines Corp.--.

Signed and Sealed this

Twenty-first Day of December, 1993

Attest:

BRUCE LEHMAN

*Attesting Officer*     *Commissioner of Patents and Trademarks*

UNITED STATES PATENT AND TRADEMARK OFFICE
CERTIFICATE OF CORRECTION

PATENT NO. : 5,200,023
DATED : April 6, 1993
INVENTOR(S) : Gifford et al

It is certified that error appears in the above-indentified patent and that said Letters Patent is hereby corrected as shown below:

On the title page, Item [73] Assignee; the abbreviation "Corp." should be spelled out "International Business Machines Corporation."

Signed and Sealed this

Thirty-first Day of May, 1994

*Attest:*

BRUCE LEHMAN

*Attesting Officer*     *Commissioner of Patents and Trademarks*